United States Patent
Liao et al.

(10) Patent No.: US 7,683,637 B2
(45) Date of Patent: *Mar. 23, 2010

(54) TOUCH SENSOR WITH ELECTROSTATIC IMMUNITY AND SENSING METHOD THEREOF

(75) Inventors: Tung-Tsai Liao, Hsin Chu (TW); Li Sheng Lo, Hsin Chu County (TW)

(73) Assignee: Generalplus Technology Inc., Hsinchu (TW)

( * ) Notice: Subject to any disclaimer, the term of this patent is extended or adjusted under 35 U.S.C. 154(b) by 97 days.

This patent is subject to a terminal disclaimer.

(21) Appl. No.: 11/984,409

(22) Filed: Nov. 16, 2007

(65) Prior Publication Data

US 2009/0021268 A1    Jan. 22, 2009

(30) Foreign Application Priority Data

Jul. 19, 2007    (TW) ................ 96126287 A

(51) Int. Cl.
*G01R 27/26* (2006.01)
(52) U.S. Cl. ............... 324/678; 324/686; 324/663
(58) Field of Classification Search ........... 324/686, 324/678, 663
See application file for complete search history.

(56) References Cited

U.S. PATENT DOCUMENTS

| | | | |
|---|---|---|---|
| 2002/0109672 A1* | 8/2002 | Kehlstadt et al. | 345/157 |
| 2007/0032967 A1* | 2/2007 | Feen et al. | 702/47 |
| 2008/0042971 A1* | 2/2008 | Sachs | 345/156 |

* cited by examiner

*Primary Examiner*—Amy He
(74) *Attorney, Agent, or Firm*—Muncy, Geissler, Olds & Lowe, PLLC

(57) ABSTRACT

The present invention relates to a touch sensor with electrostatic immunity and sensing method thereof. The touch sensor includes a sensing electrode, a discharge element, a sensing-controlling terminal and an input-output (I/O) control terminal, wherein the discharge element is coupled between the sensing-controlling terminal and the I/O control terminal and the sensing electrode is coupled to the sensing-controlling terminal. The essence of the present invention is using charge-discharge through the sensing-controlling terminal and the I/O control terminal for sensing whether a conductor contacts the sensing electrode. There are corresponding compensations no matter an electrostatic charge on the sensing electrode is positive charge or negative charge. Therefore, the influence of electrostatic charge can be eliminated.

12 Claims, 7 Drawing Sheets

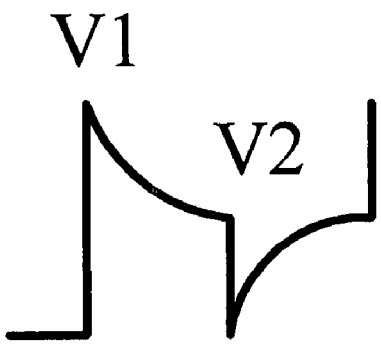
FIG. 6A  sensing electrode without charge
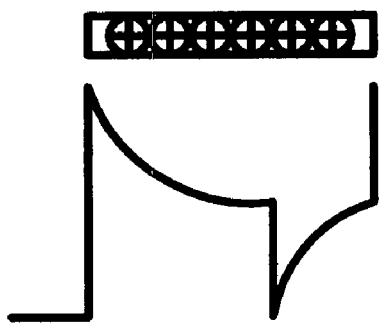
FIG. 6B  sensing electrode with positive charge
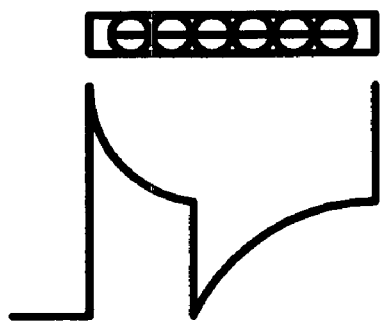
FIG. 6C  sensing electrode with negative charge

TOUCH SENSOR WITH ELECTROSTATIC IMMUNITY AND SENSING METHOD THEREOF

This application claims the benefit of the filing date of Taiwan Application Ser. No. "096126287", filed on "Jul. 19, 2007", the content of which is incorporated herein by reference.

BACKGROUND OF THE INVENTION

1. Field of the Invention

The present invention relates to a technology of touch sensor, and more particularly, to a touch sensor with electrostatic immunity and sensing method thereof.

2. Description of the Related Art

In recent years, due to the development of technology, control buttons, such as buttons of an elevator or a game console, evolve from a mechanical type of button into a touch sensor. FIG. 1 is a circuit diagram depicting a capacitive touch sensor in the prior art. Referring to FIG. 1, the touch sensor includes a sensing electrode 101, a resistor 102 and a sensing-control terminal 103, wherein the sensing electrode 101 in the circuit is equivalent to a grounding capacitor Cx.

FIG. 2 illustrates an operational waveform diagram of node A coupled by the sensing electrode 101 and the resistor 102. Referring to FIG. 1 and FIG. 2, in the beginning, the sensing-control terminal 103 charges the node A to a first preset voltage V20, and then the node A is set to high-impedance. Afterward, since the sensing electrode 101 is equivalent to the grounding capacitor Cx, so that the sensing electrode 101 starts to discharge through the resistor 102. The sensing-control terminal 103 continuously detecting a voltage of node A. When the voltage of node A discharges to a second preset voltage V21, the sensing-control terminal 103 determines whether a finger touches the sensing electrode according to a period when the voltage of node A is discharged from the first preset voltage V20 to the second preset voltage, and then the sensing-control terminal 103 begin to charge the node A.

Referring to FIG. 2, the waveform 201 is a voltage waveform of node A when a finger does not touch the sensing electrode 101, and the waveform 202 is a voltage waveform of node A when a finger touches the sensing electrode 101. According to the waveforms, when a finger touches the sensing electrode 101, the equivalent capacitor of the sensing electrode 101 is increased, so that a discharge time T2 of the waveform 202 is longer than a discharge time T1 of the waveform 201. Therefore, as long as it is determined that the period when the voltage of node A is discharged from the first preset voltage V20 to the second preset voltage V21 is longer than the discharge time T1 by the sensing-control terminal, it can be determined that the sensing electrode 101 is touched.

The surface of the sensing electrode 101 is generally made of plastics, such as a polyethylene, polypropylene, and so on. In this type of the capacitive sensor, the sensing electrode 101 is comparatively easy to be influenced by the electrostatic on its surface material. This kind of plastics, such as a polyethylene, polypropylene, and so on, has a characteristic which the accumulated electrostatic therein is hard to eliminate. FIG. 3 is an operational waveform of the node A when the sensing electrode 101 in the prior art is affected by the electrostatic. Referring to FIG. 3, when a finger operates on the abovementioned plastics, the electrostatic will be gradually induced in or out from the plastics, so that the electrical field of the surface of the sensing electrode 101 will be changed. When the surface material of the sensing electrode 101 has positive charges, the discharge time will be increased, the waveform of the node A should be as waveform 301. When the surface material of the sensing electrode 101 has negative charges, the discharge time will be reduced, and the waveform of the node A should be as waveform 302.

Hence, in above two situations, it should be noted that only detecting the discharge time cannot accurately determine whether an object is close to the sensing electrode, and the apparatus controlled by the conventional touch sensor may be abnormal.

SUMMARY OF THE INVENTION

In view of the above-mentioned problems, the present invention is direct to a touch sensor and the sensing method thereof for elimination of electrostatic influence and increasing sensing accuracy.

In addition, the present invention is directed to a touch sensor for compensation when the generated electrostatic thereof is positive or negative.

To achieve the above-mentioned object and others, a touch sensor is provided in the present invention. The touch sensor includes a first sensing electrode, a first discharge element, a first sensing-control terminal and an input-output control terminal. The first discharge element is coupled between the first sensing-control terminal and the input-output control terminal. The first sensing electrode is coupled to the first sensing-control terminal. When the first sensing-control terminal charges the first sensing electrode to a first voltage, a voltage of the input-output control terminal is set to a first common voltage and the first sensing-control terminal is set to high-impedance. When a voltage of the first sensing electrode is discharged from the first voltage to the second voltage, a voltage of the first sensing-control terminal is set to the first common voltage for a preset period, and then he first sensing-control terminal is set to high-impedance, and the voltage of the input-output control terminal is set to a second common voltage. When the voltage of the first sensing-control terminal is charged from the first common voltage to a third voltage, whether a conductor contacts the first sensing electrode is determined according to a period when the voltage of the first sensing electrode is discharged from the first voltage to the second voltage plus a period when the voltage of the first sensing electrode is charged from the first common voltage to the third voltage A sensing method for determining whether a conductor contacts a touch sensor is provided in the present invention. The method includes: providing a first sensing electrode, a first discharge element, a first sensing-control terminal and a input-output control terminal, wherein the first discharge element is coupled between the first sensing-control terminal and the input-output control terminal, and the first sensing electrode is coupled to the first sensing-control terminal; when the first sensing-control terminal charges the first sensing electrode to a first voltage, a voltage of the input-output control terminal is set to a first common voltage, and the first sensing-control terminal is set to high-impedance; when the voltage of the first sensing-control terminal is discharged to a second voltage, the voltage of the first sensing-control terminal is set to the first common voltage for a preset period, and then the first sensing-control terminal is set to high-impedance, and a voltage of the input-output control terminal is set to a second common voltage; when the voltage of the first sensing-control terminal is charged from the first common voltage to the third voltage, determining whether a conductor contacts the first sensing electrode according to a period when the voltage of the first sensing electrode is discharged from the first voltage to the second voltage plus a period when the voltage of the first sensing electrode is charged from the first common voltage to the third voltage According to the sensing method and the touch sensor in the embodiment of the present invention, the touch sensor further comprises $2^{nd}$ to Nth sensing electrodes, $2^{nd}$ to Nth sensing-control terminals and $2^{nd}$ to Nth discharge elements, wherein the $i^{th}$ sensing electrode is coupled to the $i^{th}$ sensing-control terminal, and a first terminal of the $i^{th}$ discharge element is coupled to the $i^{th}$ sensing electrode, a second terminal of the $i^{th}$ discharge element is coupled to the input-output control terminal, wherein N and i is nature number, and 0<i<N. in $i^{th}$ time interval, when the $i^{th}$ sensing-control terminal charges the $i^{th}$ sensing electrode to the first voltage, the voltage of the input-output control terminal is set to the first common voltage, and the $i^{th}$ sensing-control terminal is set to high-impedance; when the voltage of the $i^{th}$ sensing-control terminal is discharged from the first voltage to the second voltage, the voltage of the $i^{th}$ sensing-control terminal is set to the first common voltage for the preset time, and then the $i^{th}$ sensing-control terminal is set to high-impedance, and the input-output control terminal is set to the second common voltage; when the voltage of the $i^{th}$ sensing-control terminal is charged from the first common voltage to the third voltage, determining whether a conductor contacts the $i^{th}$ sensing electrode according to a period when the voltage of the $i^{th}$ first sensing electrode is discharged from the first voltage to the second voltage plus a period when the voltage of the $i^{th}$ first sensing electrode is charged from the first common voltage to the third voltage According to the sensing method and the touch sensor in the embodiment of the present invention, the touch sensor further includes a second sensing electrode which is coupled to the input-output control terminal. In a first time interval, when the first sensing-control terminal charges the first sensing electrode to the first voltage, the voltage of the input-output terminal is set to the first common voltage, and the first sensing-control terminal is set to high-impedance; when the voltage of the first sensing electrode is discharged from the first voltage to the second voltage, the voltage of the first sensing-control terminal is set to the first common voltage for the preset period, and then the first sensing-control terminal is set to high-impedance, and the voltage of the input-output control terminal is set to the second common voltage; when the voltage of the first sensing-control terminal is charged from the first common voltage to the third voltage, determining whether a conductor contacts the first sensing electrode according to a period when the voltage of the first sensing electrode is discharged from the first voltage to the second voltage plus a period when the voltage of the first sensing electrode is charged from the first common voltage to the third voltage. In a second time interval, when the input-output control terminal charges the second sensing electrode to the first voltage, the voltage of the first sensing-control terminal is set to the first common voltage and the input-output control terminal is set to high-impedance; when a voltage of the second sensing electrode is discharged from the first voltage to the second voltage, the voltage of the input-output control terminal is set to the first common voltage for the preset period, and then the input-output control terminal is set to high-impedance, and the first sensing-control terminal is set to the second common voltage; when the voltage of the second sensing electrode is charged from the first common voltage to the third voltage, determining whether a conductor contacts the second sensing electrode according to a period when the voltage of the second sensing electrode is discharged from the first voltage to the second voltage plus a period when the voltage of the second sensing electrode is charged from the first common voltage to the third voltage.

According to the touch sensor and the sensing method in the embodiment of the present invention, the first common voltage is a ground voltage, and the second voltage and the third voltage is between the first voltage and the first common voltage. In addition, in a prefer embodiment, the discharge element is a resistor.

The essence of the present invention is utilizing the method of charge and discharge through the sensing-controlling terminal and the input-output control terminal to sense whether a conductor contacts the sensing electrode. There are corresponding compensations no matter what an electrostatic charge on the sensing electrode is a positive charge or a negative charge. Therefore, the influence of electrostatic charge can be eliminated.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein:

FIG. 6A illustrates an operational waveform diagram when the sensing electrode has no charges according to the embodiment of the present invention.

FIG. 6B illustrates an operational waveform diagram when the sensing electrode has positive charges according to the embodiment of the present invention.

FIG. 6C illustrates an operational waveform diagram when the sensing electrode has negative charges according to the embodiment of the present invention.

EMBODIMENT OF THE INVENTION

Figure 1:
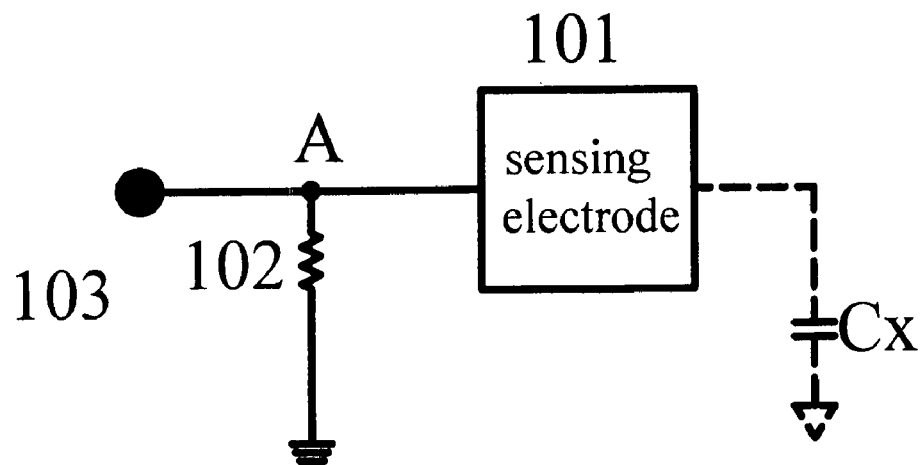
FIG. 1 is a circuit diagram depicting a touch sensor in the prior art.
Figure 2:
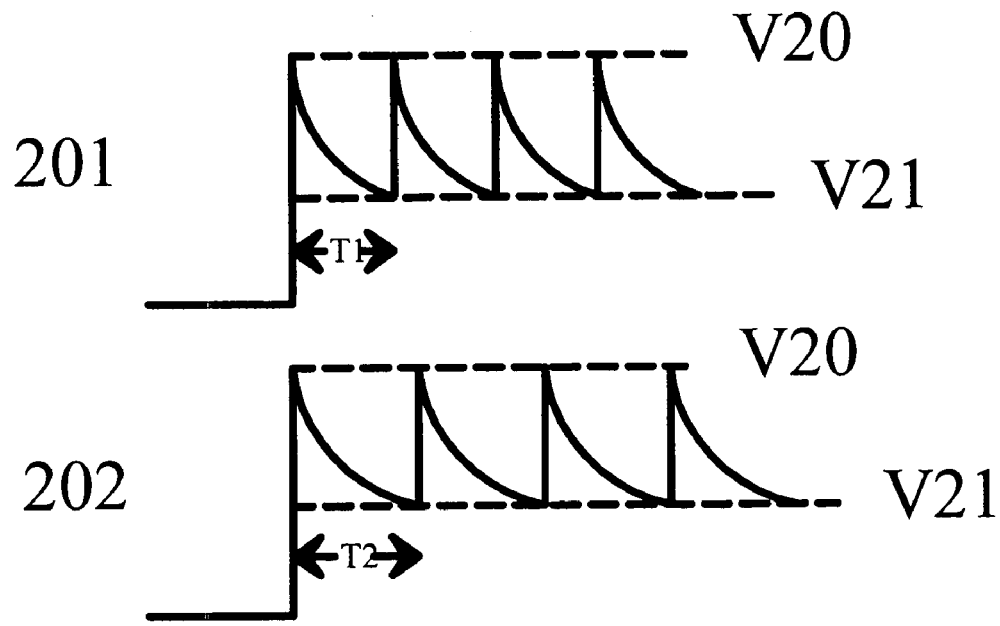
FIG. 2 illustrates an operational waveform diagram of node A coupled by the sensing electrode 101 and the resistor 102 in the prior art.
Figure 3:
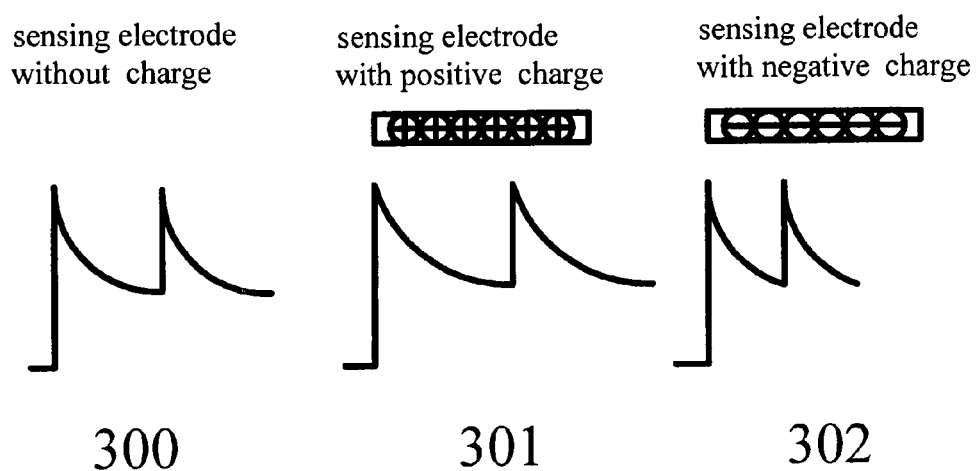
FIG. 3 illustrates an operational waveform of the node A when the sensing electrode 101 in the prior art is affected by the electrostatic.
Figure 4:
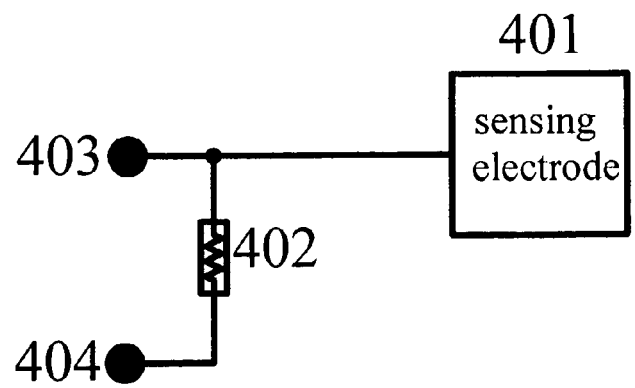
FIG. 4 is a circuit diagram depicting a touch sensor according to an embodiment of the present invention.
Figure 5:
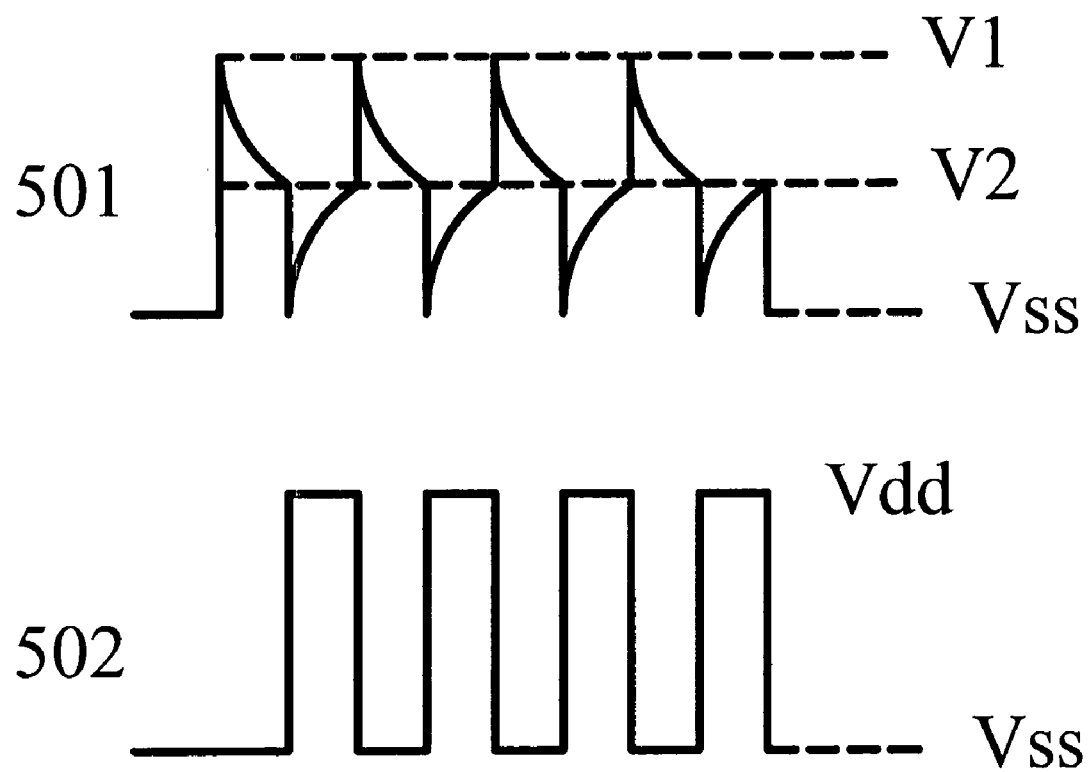
FIG. 5 illustrates an operational waveform diagram according to FIG. 4 in the embodiment of the present invention.

FIG. 4 is a circuit diagram depicting a touch sensor according to an embodiment of the present invention. Referring to FIG. 4, the touch sensor includes a sensing electrode 401, a discharge element 402, a sensing-control terminal 403 and a input-output control terminal 404, the coupling relationship of the abovementioned elements is shown in FIG. 4. FIG. 5 illustrates an operational waveform diagram according to FIG. 4 in the embodiment of the present invention. Referring to FIG. 4 and FIG. 5, the waveform 501 is a voltage waveform of the sensing-control terminal 403, and the waveform 502 is a voltage waveform of the input-output control terminal 404. Since the equivalent circuit of the sensing electrode 401 is equivalent to a capacitor whose one terminal is coupled to ground, in the beginning, the sensing-control terminal 403 charges the sensing electrode 401 to a voltage V1. Afterward, the sensing-control terminal 403 is set to high-impedance, and the voltage of the input-output control terminal 404 will be kept in a first common voltage Vss. And then the sensing electrode 401 starts to discharge into the input-output control terminal 404 through the discharge element 402. Generally, the discharge element 402 can be implemented by a resistor.

When the voltage of the sensing-control terminal 403 is discharged to a designated voltage, the voltage of the sensing-control terminal 403 will be set to the first common voltage Vss to discharge the sensing electrode 401 to the first common voltage. Afterward the sensing-control terminal 403 will be set to high-impedance. In addition, the voltage of the input-output control terminal 404 will be set to the second common voltage Vdd to charge the sensing electrode 401 through the discharge element 402. When the voltage of the sensing-control terminal 403 is charged from the first common voltage Vss to a voltage V1, the abovementioned steps will be repeated. Since the sensing electrode 401 does not be contacted by a conductor, its equivalent capacitor would not be changed, thus, the waveform measured from the sensing-control terminal 403 will be a periodic waveform. When a conductor contacts the sensing electrode 401, the equivalent capacitor of the sensing electrode 401 will be increased, and the period of the waveform measured from the sensing-control terminal 403 will be increased. Therefore, based on a period when the voltage of the sensing electrode is discharged from the voltage V1 to the voltage V2 plus a period when the voltage of the sensing electrode is charged from the common voltage Vss to the voltage V2, it can be determined whether a conductor contacts the sensing electrode 401.

FIG. 6A, FIG. 6B and FIG. 6C respectively represent operational waveform diagrams when the sensing electrode has no charges, positive charges and negative charges according to the embodiment of the present invention. Referring to FIGS. 6A and 6B, when a surface of the sensing electrode 401 has positive charges, the period when the voltage of the sensing electrode 401 is discharged from the voltage V1 to the voltage V2 will be increased, but the period when the voltage of the sensing electrode 401 is charged from the common voltage Vss to the voltage V2 will be comparatively reduced. Next, referring to FIG. 6A and FIG. 6C, when the surface of the sensing electrode 401 has negative charges, the period when the voltage of the sensing electrode 401 is discharged from the voltage V1 to the Voltage V2 will be reduced, but the period when the voltage of the sensing electrode is charged from the common voltage Vss to the voltage V2 will be comparatively increased.

In the embodiment of the present invention, no matter electrostatic charges on the sensing electrode 401 are positive charges or negative charges, a corresponding charge period or discharge period will be increased, and the other charge period or discharge period will be decreased. In other words, no matter electrostatic charges on the sensing electrode 401 are positive charges or negative charges, the sum of its charge period and its discharge period is almost equal to the sum of the charge and discharge periods when there is no electrostatic charge on the sensing electrode 401. Thus, the sensing-control terminal 403 can be used for detecting the variation of the equivalent capacitor of the sensing electrode 401, wherein the variation of the equivalent capacitor of the sensing electrode 401 includes an equivalent capacitor of a conductor contacted the sensing electrode 401 and the equivalent capacitor of the sensing electrode 401. There are corresponding compensations when the sensing electrode 401 has positive charges or negative charges. Therefore, influences by the electrostatic charge can be eliminated.

Although only the embodiments of FIG. 4, FIG. 5, FIG. 6A and FIG. 6B is taken as an example, person having ordinary skill in the art should know that the voltage V1, V2, Vss and Vdd can be changed according to different situations. In addition, the voltage of the charging destination of the sensing electrode 401 does not need to equal to the voltage of the discharging destination V2. Therefore, the present invention is not limit to the abovementioned voltage.

Several embodiments are described thereinafter to enable persons having ordinary skill in the art to implement the present invention with reference to the essence of the present invention.

Figure 7:
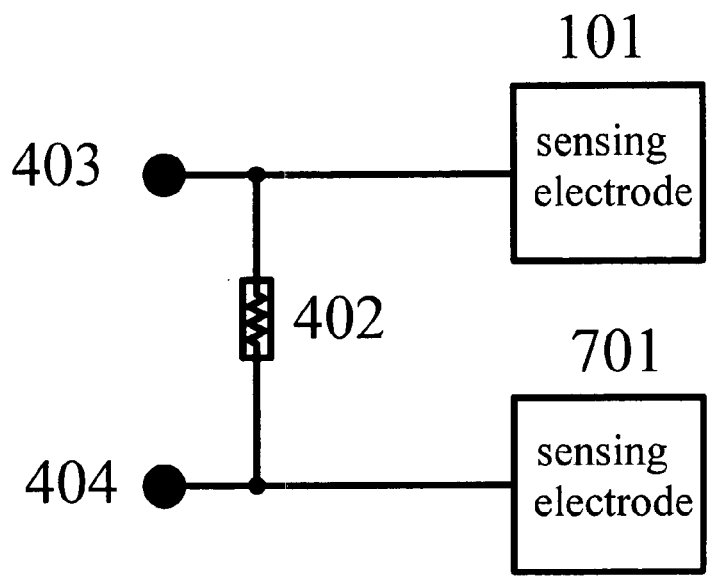
FIG. 7 is a circuit block diagram depicting a touch sensor according to an embodiment of the present invention.
Figure 8:
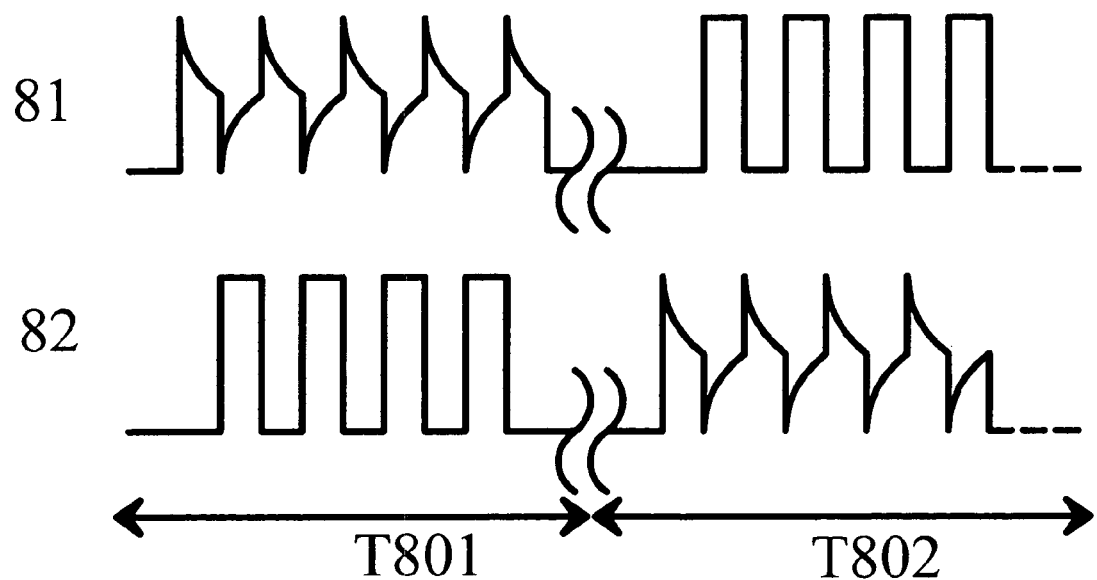
FIG. 8 illustrates an operational waveform diagram according to FIG. 7 in the embodiment of the present invention.

FIG. 7 is a circuit block diagram depicting a touch sensor according to an embodiment of the present invention. FIG. 8 illustrates an operational waveform diagram according to FIG. 7 in the embodiment of the present invention. Referring to FIG. 7, in addition to the sensing electrode 401, the discharge element 402, the sensing-control terminal 403 and input-output control terminal 404, the circuit further includes an extra sensing electrode 701. The operation of the touch sensor in FIG. 7 is similar to the operation of the touch sensor in FIG. 4. The difference between FIG. 4 and FIG. 7 is that the touch sensor of FIG. 7 is adopted the time division multiplexing (TDM) sensing. In other words, the operation of the touch sensor in FIG. 7 is divided into two phase. Referring to FIG. 8, the waveform 81 is the voltage waveform of the sensing-control terminal 403; the waveform 82 is the voltage waveform of the input-output control terminal 404.

In the first phase T801, referring to the waveform 81. First, the sensing-control terminal 403 charges the sensing electrode 401 to the voltage V1. In the same time, the voltage of the input-output control terminal 404 is set to the common voltage Vss, and then the sensing-control terminal 403 is set to high-impedance. Next, when the voltage of the sensing electrode 401 is discharged from the voltage V1 to the voltage V2, the voltage of the sensing-control terminal 403 is set to the common voltage Vss for a preset period to let the voltage of the sensing electrode 401 become the common voltage Vss, afterward, the sensing-control terminal is set to high-impedance. The input-output control terminal 404 is set to the common voltage Vdd to charge the sensing electrode 401 through the discharge element 402. Finally, when the voltage of the sensing-control terminal 403 is charged from the common voltage Vss to the voltage V2, whether a conductor contacts the sensing electrode 401 is determined according to a period when the voltage of the sensing electrode 401 is discharged from the voltage V1 to the voltage V2 plus a period when the voltage of the sensing electrode 401 is charged from the common voltage Vss to the voltage V2.

The operation in the first phase T802 is similar to the operation in the first phase T801, referring to the waveform 82. First, the input-output control terminal 404 charges the sensing electrode 701 to the voltage V1, afterward, the input-output control terminal 403 is set to high-impedance, and then the sensing-control terminal 403 is set to the common voltage Vss. Next, when the voltage of the sensing electrode 701 is discharged from the voltage V1 to the voltage V2, the input-output control terminal 404 is set to common voltage Vss for the preset period to let the voltage of the sensing electrode 701 become the common voltage Vss. Afterward, the input-output control terminal 404 is set to high-impedance 404, and then the sensing-control terminal 403 is set to the common voltage Vdd to charge the sensing electrode 701 through the discharge element 402. Finally, when the voltage of the input-output control terminal 404 is charged from the common voltage Vss to the voltage V2, whether a conductor contacts the sensing electrode 701 is determined according to a period when the voltage of the sensing electrode 701 is discharged from the voltage V1 to the voltage V2 plus a period when the sensing electrode 701 is charged from the common voltage Vss to the voltage V2.

Figure 9:
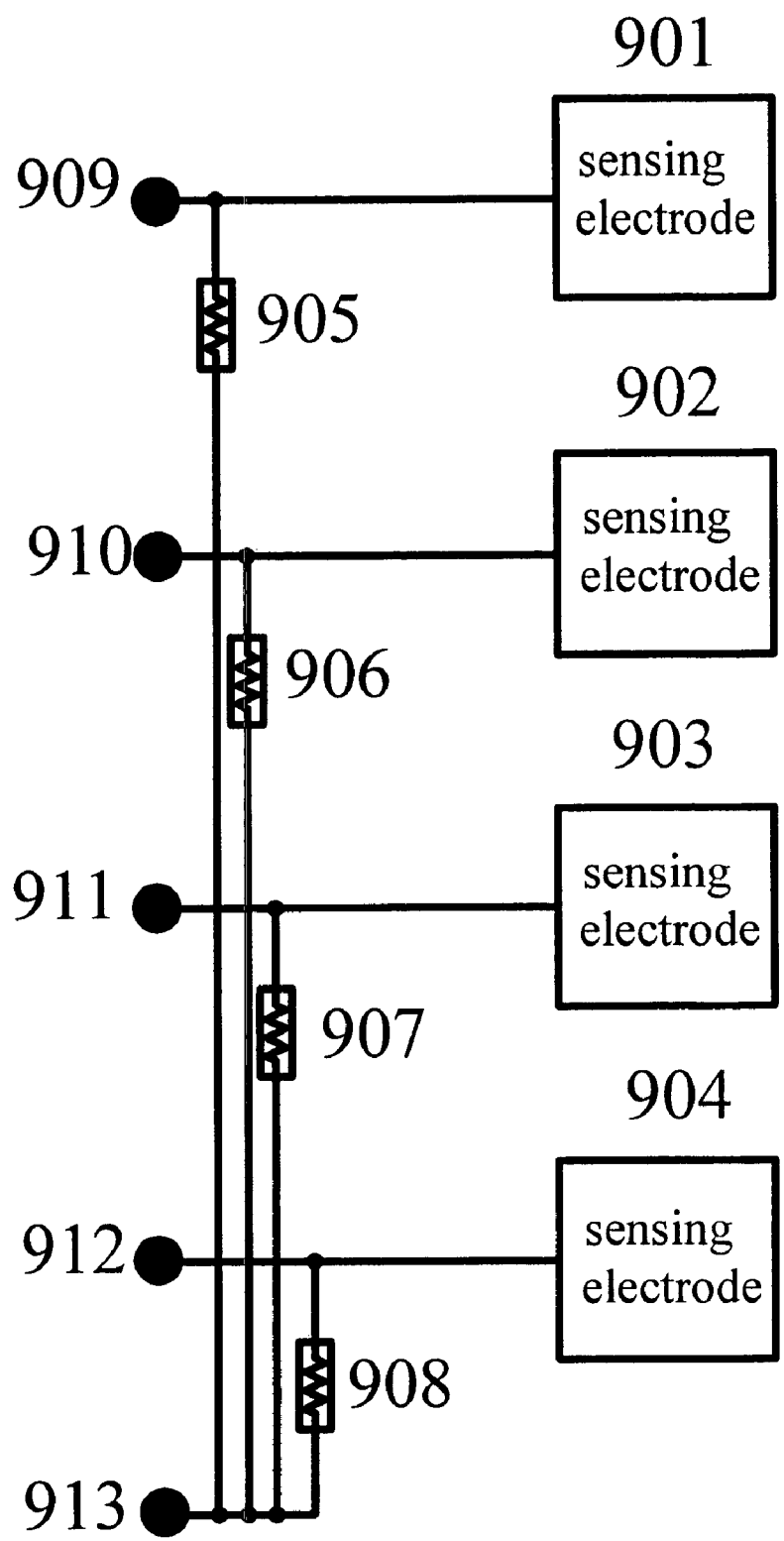
FIG. 9 is a circuit block diagram depicting a touch sensor according to an embodiment of the present invention.
Figure 10:
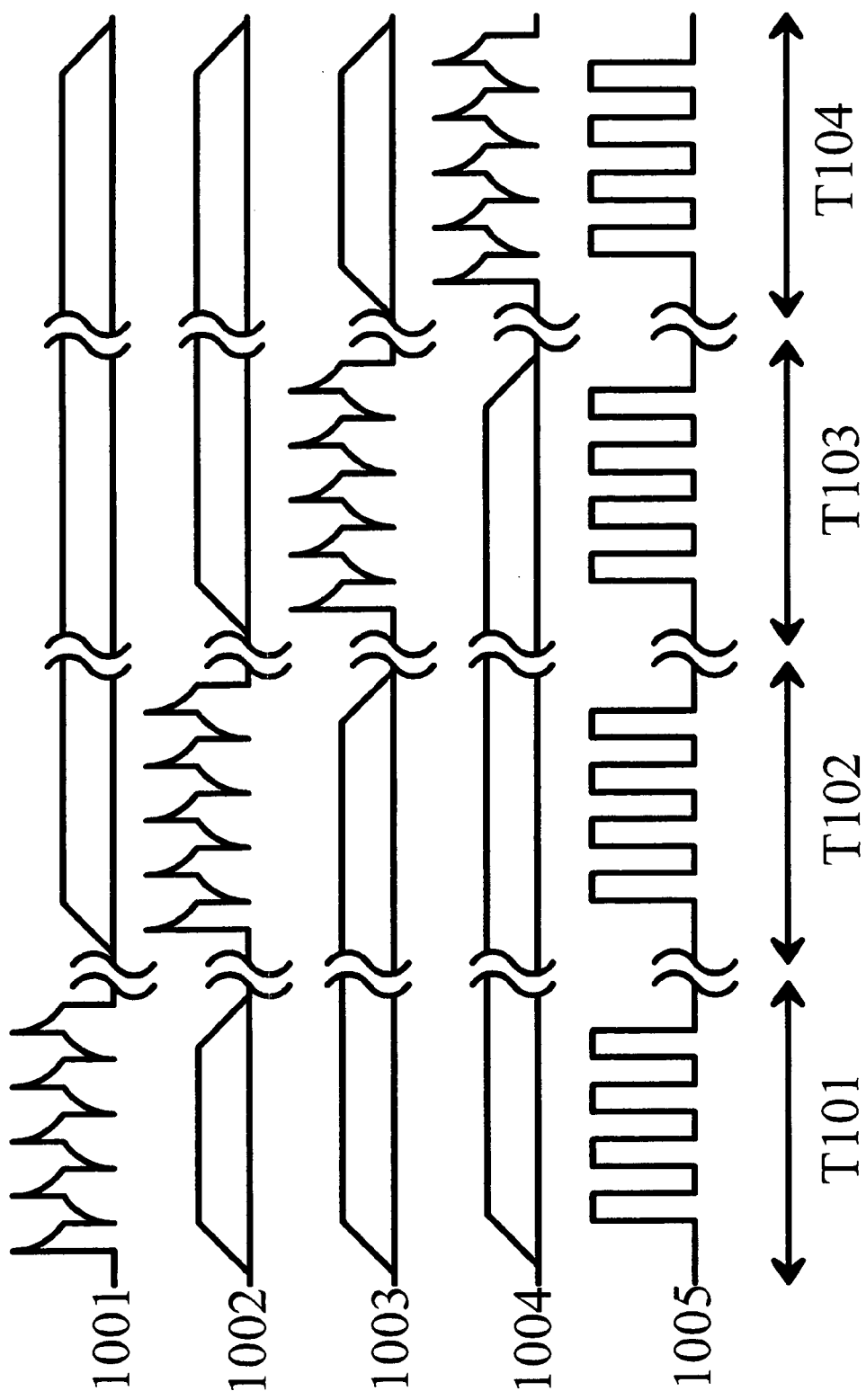
FIG. 10 illustrates an operational waveform according to FIG. 9 in the embodiment of the present invention.

FIG. 9 is a circuit block diagram depicting a touch sensor according to an embodiment of the present invention. FIG. 10 illustrates an operational waveform diagram according to FIG. 9 in the embodiment of the present invention. Referring to FIG. 9, the circuit includes 4 sensing electrodes 901~904, 4 discharge elements 905~908, 4 sensing-control terminals 909~912 and an input-output control terminal 913. Similarly, the embodiment is similar to the embodiment in FIG. 7, which is adapted for the TDM sensing.

FIG. 10 illustrates an operational waveform diagram according to FIG. 9 in the embodiment of the present invention. The waveform 1001 is the voltage waveform of the sensing-control terminal 909; the waveform 1002 is the voltage waveform of the sensing-control terminal 910; the waveform 1003 is the voltage waveform of the sensing-control terminal 911; the waveform 1004 is the voltage waveform of the sensing-control terminal 912; the waveform 1005 is the voltage waveform of the input-output control terminal 913. Referring to FIG. 9 and FIG. 10, since the circuit in the embodiment includes 4 sensing electrodes 901~904, it is necessary to divide into 4 periods T101, T102, T103 and T104 for correspondingly sensing 4 sensing electrodes 901~904. The principle of sensing is similar to the embodiments in FIG. 4 and FIG. 5, therefore, the detail description is omitted.

To sum up, the essence of the present invention is using the method of charge-discharge through the sensing-controlling terminal and the input-output control terminal for sensing whether a conductor contacts the sensing electrode. There are corresponding compensations no matter an electrostatic charge on the sensing electrode is a positive charge or a negative charge. Therefore, the influence of the electrostatic charge can be eliminated.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A touch sensor, comprising:
   a first sensing electrode;
   a first discharge element, wherein a first terminal of the first discharge element is coupled to the first sensing electrode;
   a first sensing-control terminal, coupled to the first sensing electrode and the first terminal of the first discharge element; and
   an input-output control terminal, coupled to a second terminal of the first discharge element;
   wherein,
   when the first sensing-control terminal charges the first sensing electrode to a first voltage, a voltage of the input-output control terminal is set to the first common voltage and then the first sensing-control terminal is set to high-impedance,
   when a voltage of the first sensing-control terminal is discharged from the first voltage to a second voltage, the voltage of the first sensing-control terminal is set to the first common voltage for a preset period, and then the first sensing-control terminal is set to high-impedance, and then the voltage of the input-output control terminal is set to a second common voltage,
   when the voltage of the first sensing-control terminal is charged from the first common voltage to a third voltage, determining whether a conductor contacts the first sensing electrode according to a period when the voltage of the first sensing electrode is discharged from the first voltage to the second voltage plus a period when the voltage of the first sensing electrode is charged from the first common voltage to the third voltage.

2. The touch sensor according to claim 1, wherein the first common voltage is a ground voltage.

3. The touch sensor according to claim 1, wherein the second voltage and the third voltage is between the first voltage and the first common voltage.

4. The touch sensor according to claim 1, wherein the first discharge element is a resistor.

5. The touch sensor according to claim 1, further comprising:
   $2^{nd}$ to $N^{th}$ sensing electrodes;
   $2^{nd}$ to $N^{th}$ discharge elements, wherein a first terminal of the $i^{th}$ discharge element is coupled to the $i^{th}$ sensing electrode, a second terminal of the $i^{th}$ discharge element is coupled to the input-output control terminal; and
   $2^{nd}$ to $N^{th}$ sensing-control terminals, wherein the $i^{th}$ sensing-control terminal is coupled to the $i^{th}$ sensing electrode,
   wherein N and I is a nature number, and $0<i<N$,
   in a $i^{th}$ time interval,
   when the $i^{th}$ sensing-control terminal charge the $i^{th}$ sensing electrode to the first voltage, the voltage of the input-output terminal is set to the first common voltage, and then the $i^{th}$ sensing-control terminal is set to high-impedance,
   when the voltage of the $i^{th}$ sensing-control terminal is discharged from the first voltage to the second voltage, the voltage of the $i^{th}$ sensing-control terminal is set to the first common voltage, and then the $i^{th}$ sensing-control terminal set to high impedance, and the input-output control terminal is set to the second common voltage,
   when the voltage of the $i^{th}$ sensing-control terminal is charged from the first common voltage to the third voltage, determining whether a conductor contacts the $i^{th}$ sensing electrode according to a period when the voltage of the $i^{th}$ sensing electrode is discharged from the first voltage to the second voltage plus a period when the voltage of the $i^{th}$ sensing electrode is charged from the first common voltage to the third voltage.

6. The touch sensor according to claim 1, further comprising:
- a second sensing electrode, coupled to the input-output control terminal and the second terminal of the first discharge element;
- wherein, in a first time interval,
- when the first sensing-control terminal charges the first sensing electrode to the first voltage, the input-output control terminal is set to the first common voltage, and the first sensing-control terminal is set to high-impedance,
- when the voltage of the first sensing-control terminal is discharged from the first voltage to the second voltage, the voltage of the first sensing-control terminal is set to the first common voltage for a preset time, and then the first sensing-control terminal is set to high-impedance, and then the voltage of the input-output control terminal is set to the second common voltage;
- when the voltage of the first sensing-control terminal is charged from the first common voltage to a third voltage, determining whether a conductor contacts the first sensing electrode according to a period when the voltage of the first sensing electrode is discharged from the first voltage to the second voltage plus a period when the voltage of the first sensing electrode is charged from the first common voltage to the third voltage;
- in a second time interval,
- when the input-output control terminal charges the second sensing electrode to the first voltage, the voltage of the first sensing-control terminal is set to the first common voltage, and then the input-output control terminal is set to high-impedance,
- when the voltage of the input-output control terminal is discharged from the first voltage to the second voltage, the voltage of the input-output terminal is set to the first common voltage for the preset period, and the input-output terminal is set to high-impedance, and the voltage of the first sensing-control terminal is set to the second common voltage,
- when the voltage of the input-output control terminal is charged from the first common voltage to the third voltage, determining whether a conductor contacts the second sensing electrode according to a period when the voltage of the second sensing electrode is discharged from the first voltage to the second voltage plus a period when the voltage of the second sensing electrode is charged from the first common voltage to the third voltage.

7. A sensing method for determining whether a conductor contacts a touch sensor, comprising:
- providing a first sensing electrode, a first discharge element, a first sensing-control terminal and a input-output terminal, wherein the first discharge element is coupled between the first sensing-control terminal and the input-output terminal, and the first sensing electrode is coupled to the first sensing-control terminal;
- when the first sensing-control terminal charges the first sensing electrode to the first voltage, a voltage of the input-output control terminal is set to the first common voltage and the first sensing-control terminal is set to high-impedance;
- when a voltage of the first sensing-control terminal is discharged from the first voltage to a second voltage, the voltage of the first sensing-control terminal is set to the first common voltage for a preset period and then the first sensing-control terminal is set to high-impedance, and the voltage of the input-output control terminal is set to a second common voltage; and
- when the voltage of the first sensing-control terminal is charged from the first common voltage to a third voltage, determining whether a conductor contacts the first sensing electrode according to a period when the voltage of the first sensing electrode is discharged from the first voltage to the second voltage plus a period when the voltage of the first sensing electrode is charged from the first common voltage to the third voltage.

8. The sensing method according to the claim 7, wherein the first common voltage is a ground voltage.

9. The sensing method according to the claim 7, wherein the second voltage and the third voltage are between the first common voltage and the first voltage.

10. The sensing method according to the claim 7, wherein the discharge element is a resistor.

11. The sensing method according to the claim 7, further comprising:
- providing $2^{nd}$ to $N^{th}$ sensing electrodes;
- providing $2^{nd}$ to $N^{th}$ discharge elements, wherein a first terminal of the $i^{th}$ discharge element is coupled to the ith sensing electrode, a second terminal of the $i^{th}$ discharge element is coupled to the input-output control terminal, wherein N and i are nature number and $0<i<N$; and
- providing $2^{nd}$ to $N^{th}$ sensing-control terminals, wherein the $i^{th}$ sensing-control terminal is coupled to the $i^{th}$ sensing electrode;
- in a $i^{th}$ time interval,
- when the $i^{th}$ sensing-control terminal charges the $i^{th}$ sensing electrode to the first voltage, the voltage of the input-output control terminal is set to the first common voltage, and then the $i^{th}$ sensing-control terminal is set to high-impedance;
- when a voltage of the $i^{th}$ sensing-control terminal is discharged from the first voltage to the second voltage, the voltage of the $i^{th}$ sensing-control terminal is set to the first common voltage for the preset time, and then the $i^{th}$ sensing-control terminal is set to high-impedance, and the voltage of the input-output control terminal is set to the second common voltage; and
- when the voltage of the $i^{th}$ sensing-control terminal is charged from the first common voltage to the third voltage, determining whether a conductor contacts the $i^{th}$ sensing electrode according to a period when the voltage of the $i^{th}$ sensing electrode is discharged from the first voltage to the second voltage plus a period when the voltage of the $i^{th}$ sensing electrode is charged from the first common voltage to the third voltage.

12. The sensing method according to the claim 7, further comprising:
- providing a second sensing electrode, coupled to the input-output control terminal and the second terminal of the first discharge element;
- in a first time interval,
- when the first sensing-control terminal charge the first sensing electrode to the first voltage, the voltage of the input-output terminal is set to the first common voltage and the first sensing-control terminal is set to high-impedance;
- when the voltage of the first sensing-control terminal is discharged from the first voltage to the second voltage, the voltage of the first sensing-control terminal is set to the first common voltage for the preset period and then the first sensing-control terminal is set to high-impedance, and the voltage of the input-output control terminal is set to the second common voltage; and when the voltage of the first sensing-control terminal is charged from the first common voltage to the third voltage, determining whether a conductor contacts the first sensing electrode according to a period when the voltage of the first sensing electrode is discharged from the first voltage to the second voltage plus a period when the voltage of the first sensing electrode is charged from the first common voltage to the third voltage; and in a second time interval, when the input-output control terminal charges the second sensing electrode to the first voltage, the voltage of the first sensing-control terminal is set to the first common voltage and the input-output control terminal is set to high-impedance;

when the voltage of the input-output control terminal is discharged from the first voltage to the second voltage, the voltage of the input-output control terminal is set to the first common voltage for the preset period, and then the input-output control terminal is set to high-impedance, and the voltage of the first sensing-control terminal is set to the second common voltage; and when the voltage of the input-output control terminal is charged from the first common voltage to the third voltage, determining whether a conductor contacts the second sensing electrode according to a period when the voltage of the second sensing electrode is discharged from the first voltage to the second voltage plus a period when the voltage of the second sensing electrode is charged from the first common voltage to the third voltage.

* * * * *